(12) United States Patent
Flachowsky et al.

(10) Patent No.: US 8,329,551 B2
(45) Date of Patent: Dec. 11, 2012

(54) SEMICONDUCTOR DEVICE SUBSTRATE WITH EMBEDDED STRESS REGION, AND RELATED FABRICATION METHODS

(75) Inventors: Stefan Flachowsky, Dresden (DE); Jan Hoentschel, Dresden (DE); Thilo Scheiper, Dresden (DE)

(73) Assignee: Globalfoundries, Inc., Grand Cayman (KY)

( * ) Notice: Subject to any disclaimer, the term of this patent is extended or adjusted under 35 U.S.C. 154(b) by 31 days.

(21) Appl. No.: 12/947,460

(22) Filed: Nov. 16, 2010

(65) Prior Publication Data

US 2012/0119259 A1 May 17, 2012

(51) Int. Cl.
*H01L 21/20* (2006.01)
(52) U.S. Cl. ....................................................... 438/387
(58) Field of Classification Search .................... 438/387
See application file for complete search history.

(56) References Cited

U.S. PATENT DOCUMENTS

| | | | |
|---|---|---|---|
| 2005/0277260 A1* | 12/2005 | Cohen et al. | 438/387 |
| 2009/0309160 A1* | 12/2009 | Cohen et al. | 257/350 |
| 2010/0047985 A1* | 2/2010 | Dakshina Murthy et al. | 438/303 |
| 2010/0221883 A1* | 9/2010 | Kronholz et al. | 438/285 |

* cited by examiner

*Primary Examiner* — Charles Garber
*Assistant Examiner* — Andre' C Stevenson
(74) *Attorney, Agent, or Firm* — Ingrassia Fisher & Lorenz, P.C.

(57) ABSTRACT

A semiconductor device substrate is presented here. The semiconductor device substrate includes a layer of first semiconductor material having a first lattice constant, a region of second semiconductor material located in the layer of first semiconductor material, and a layer of epitaxially grown third semiconductor material overlying the layer of first semiconductor material and overlying the region of second semiconductor material. The second semiconductor material has a second lattice constant that is different than the first lattice constant. Moreover, the layer of epitaxially grown third semiconductor material exhibits a stressed zone overlying the region of second semiconductor material. The stressed zone has a third lattice constant that is different than the first lattice constant.

20 Claims, 4 Drawing Sheets

SEMICONDUCTOR DEVICE SUBSTRATE WITH EMBEDDED STRESS REGION, AND RELATED FABRICATION METHODS

TECHNICAL FIELD

Embodiments of the subject matter described herein relate generally to semiconductor device substrates and related semiconductor device fabrication processes. More particularly, embodiments of the subject matter relate to the fabrication and use of a semiconductor device substrate having an embedded stress region in a layer of semiconductor material.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor substrate, and spaced-apart source and drain regions formed within the semiconductor substrate and between which a current can flow. The source and drain regions are typically accessed via respective conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts.

Strain engineering is often used to enhance the performance of semiconductor transistor devices. For example, embedded strain elements (i.e., doped or undoped semiconductor material that laterally stresses the channel region) can be used to improve the mobility of carriers in the channel region. Other approaches, such as the stress memory technique (SMT) and the use of tensile plasma enhanced nitride (TPEN) as a stress liner can be used to impart stress to a semiconductor transistor device. These approaches, however, indirectly apply stress to the channel region. Consequently, these techniques result in somewhat inefficient coupling of stress to the channel region.

Accordingly, it is desirable to efficiently apply stress to the channel region of a semiconductor transistor device in a way that does not require complex process steps. In addition, it is desirable to have a semiconductor device substrate that includes semiconductor material with a stressed region suitable for fabricating the channel region of a semiconductor transistor device. Furthermore, other desirable features and characteristics will become apparent from the subsequent detailed description and the appended claims, taken in conjunction with the accompanying drawings and the foregoing technical field and background.

BRIEF SUMMARY

A method of fabricating a semiconductor device substrate is provided. The method forms a channel cavity in a layer of first semiconductor material having a first lattice constant. The method continues by filling the channel cavity with a second semiconductor material having a second lattice constant that is different than the first lattice constant. The method may involve other steps to obtain an intermediate-state substrate having an upper surface, the upper surface corresponding to an exposed portion of the first semiconductor material and an exposed portion of the second semiconductor material. The method continues by epitaxially growing a third semiconductor material overlying the upper surface of the intermediate-state substrate. The epitaxial growth of the third semiconductor material forms a stressed zone overlying the second semiconductor material, the stressed zone having a third lattice constant that is different than the first lattice constant.

Also provided is a semiconductor device substrate having: a layer of first semiconductor material having a first lattice constant; a region of second semiconductor material located in the layer of first semiconductor material, the second semiconductor material having a second lattice constant that is different than the first lattice constant; and a layer of epitaxially grown third semiconductor material overlying the layer of first semiconductor material and overlying the region of second semiconductor material. The layer of epitaxially grown third semiconductor material has a stressed zone overlying the region of second semiconductor material. The stressed zone has a third lattice constant that is different than the first lattice constant.

A method of fabricating a semiconductor device structure is also provided. The method involves the fabrication of a semiconductor device substrate comprising a layer of first semiconductor material, a region of second semiconductor material located in the layer of first semiconductor material, a stressed zone of epitaxially grown third semiconductor material overlying the region of second semiconductor material, and nominal zones of the epitaxially grown third semiconductor material overlying the first semiconductor material. The method continues by forming a semiconductor transistor device structure on the semiconductor device substrate. The semiconductor transistor device structure includes a gate structure aligned with the stressed zone of epitaxially grown third semiconductor material, such that the stressed zone of epitaxially grown third semiconductor material corresponds to a stressed channel region of the semiconductor transistor device structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
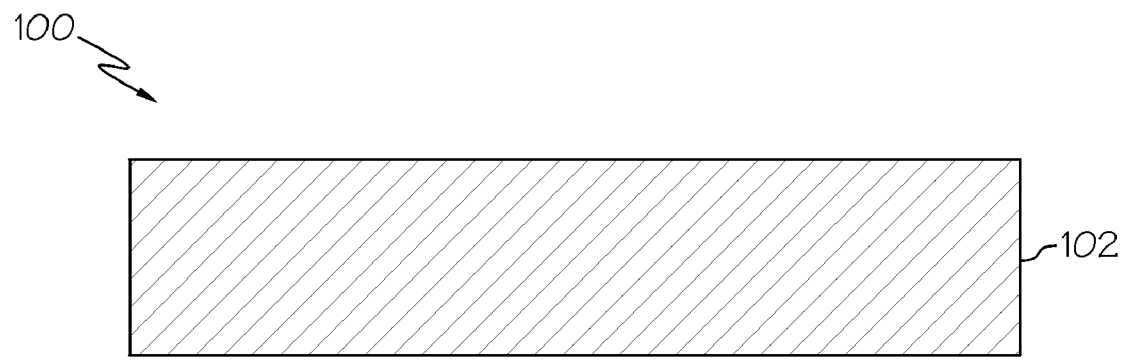
FIGS. 1-6 are cross-sectional views that illustrate the fabrication of a semiconductor device substrate.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology may also be used in the following description for the purpose of reference only, and thus are not intended to be limiting. For example, terms such as "upper," "lower," "above," and "below" refer to directions in the drawings to which reference is made. Terms such as "front," "back," "rear," "side," "outboard," and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second," and other such numerical terms referring to structures do not imply a sequence or order unless clearly indicated by the context.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate a substrate or wafer for semiconductor devices such as one or more transistor devices, typically, metal-oxide-semiconductor (MOS) transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

The subject matter presented here relates to the fabrication and use of a new type of semiconductor device substrate or wafer. This new semiconductor device substrate includes an upper layer of epitaxially grown semiconductor material, such as silicon. Some of the epitaxial silicon grows from an underlying layer of pure silicon, which may represent bulk silicon or a silicon-on-insulator layer. A different portion of the epitaxial silicon grows from an underlying region of stress-inducing semiconductor material, such as silicon germanium. The epitaxial silicon nucleated from the silicon germanium has a lattice constant that is different than the lattice constant of the "normal" silicon. Consequently, the epitaxial silicon grown on the silicon germanium represents a stressed zone or region of the upper layer of silicon. This stressed zone can thereafter be used as the channel region for a semiconductor transistor device that is fabricated from the semiconductor device substrate.

FIGS. 1-6 are cross-sectional views that illustrate the fabrication of a semiconductor device substrate 100, which is suitable for the manufacture of semiconductor transistor devices and other semiconductor devices as so desired. As depicted in FIG. 1, the substrate 100 includes a layer of semiconductor material 102. The semiconductor material 102 is preferably a silicon material as typically used in the semiconductor industry, e.g., relatively pure silicon. Alternatively, the semiconductor material 102 can be germanium, gallium arsenide, or the like. The semiconductor material 102 can be either n-type or p-type, but is typically lightly doped p-type. Moreover, the semiconductor material 102 may be part of a bulk semiconductor wafer, or it may be realized as a thin layer of semiconductor material on an insulating substrate (commonly known as semiconductor-on-insulator, silicon-on-insulator, or SOI) that, in turn, is supported by a carrier wafer. The semiconductor material 102 has a particular lattice constant associated therewith, as is well understood by those of ordinary skill in the art.

Figure 2:
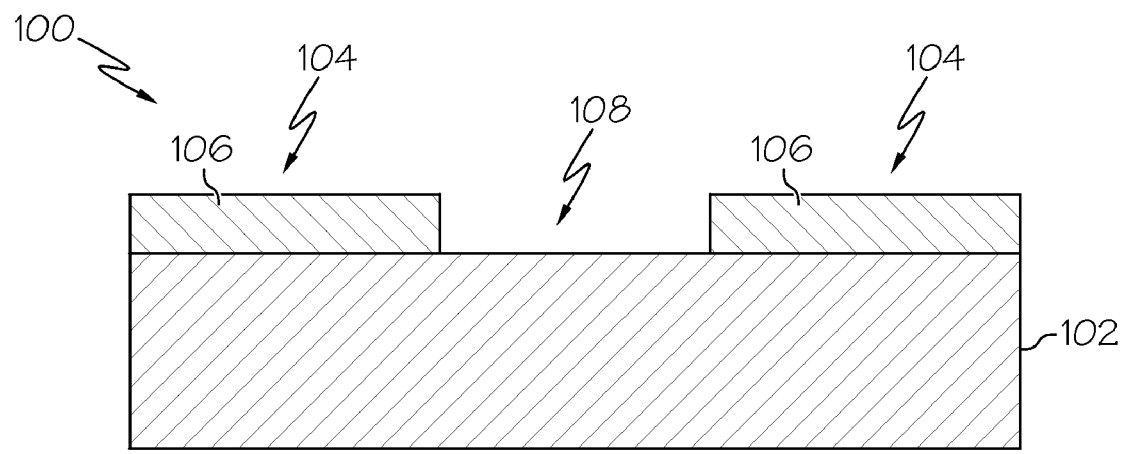

Processing of the substrate 100 continues by creating a patterned mask 104 overlying the layer of semiconductor material 102 (see FIG. 2). The patterned mask 104 may be formed using well known process steps associated with material deposition, photolithography, etching, etc. Depending upon the particular embodiment, the patterned mask 104 could be realized as a hard mask, as a photoresist mask, or the like. The patterned mask 104 includes features 106 that protect certain portions of the underlying layer of semiconductor material 102, and an opening 108 that exposes some of the layer of semiconductor material 102. As will become apparent from the following description, the features 106 and the opening 108 correspond to a channel cavity and a channel region of a semiconductor transistor device (see FIG. 9). In practice, the substrate 100 may be used to create a very large number of transistor devices and, therefore, the patterned mask 104 could include many features and openings (as needed) associated with the desired layout of transistor devices. Moreover, the patterned mask 104 could be utilized to define or otherwise provide alignment marks and/or other reference indicators that can be used to align other masks (etch masks, ion implantation masks, protective masks, etc.) used during subsequent process steps.

Figure 3:
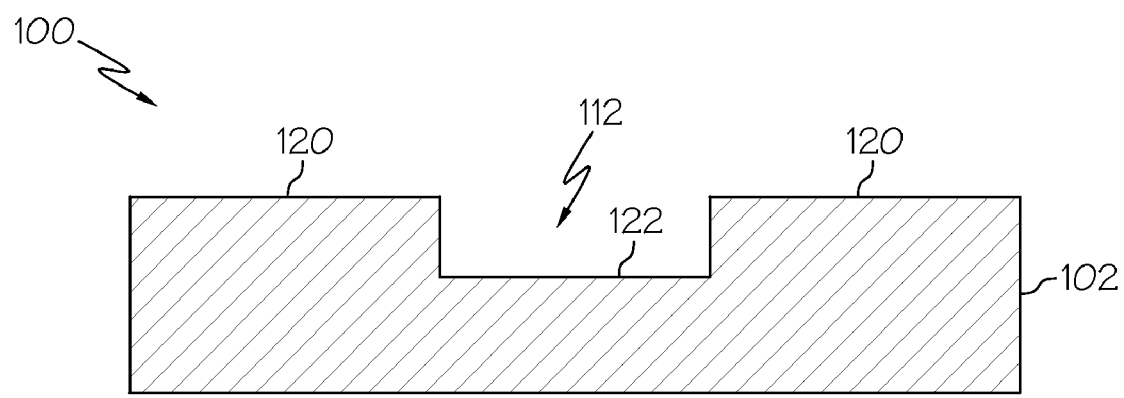

Next, the layer of semiconductor material 102 is selectively etched, using the patterned mask 104 as an etch mask. FIG. 3 depicts the state of the substrate 100 after completion of the etching step, which forms a channel cavity 112 in the layer of semiconductor material 102, and after the patterned mask 104 has been removed. As shown in FIG. 3, a portion of the layer of semiconductor material 102 is removed by etching to create the channel cavity 112. This etching process (which may be, for example, a reactive ion etching process) is controlled in a suitable manner to etch the layer of semiconductor material 102 by the desired amount. For example, the channel cavity 112 can be etched such that it has a depth within the range of about 10 nm to about 50 nm, although different depths can be utilized depending upon the embodiment. Ideally, the resulting channel cavity 112 will have a rectangular profile and vertical sidewalls as depicted in FIG. 3. In practice, however, the channel cavity 112 need not have vertical or straight sidewalls. For example, the channel cavity 112 could be formed with tapered (angled) sidewalls.

Figure 4:
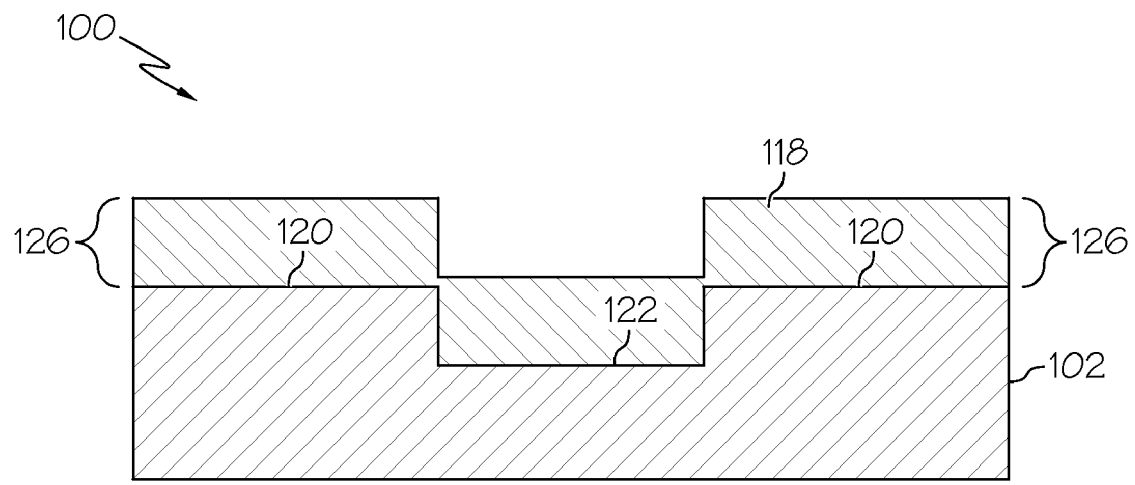

Although other fabrication steps or sub-processes may be performed after the formation of the channel cavity 112, this example continues by filling the channel cavity 112 with a stress-inducing semiconductor material 118 (see FIG. 4). For this embodiment, the stress-inducing semiconductor material 118 is formed by epitaxial growth. In this regard, the stress-inducing semiconductor material 118 is epitaxially grown on the exposed surfaces of the semiconductor material 102. Referring back to FIG. 3, the stress-inducing semiconductor material 118 grows from the upper surface 120 of the semiconductor material 102 (which flanks the channel cavity 112), and from the surface 122 of the semiconductor material 102 that defines the bottom surface of the channel cavity 112. Accordingly, this epitaxial growth step results in overburden material 126 nucleated from the upper surface 120 of the semiconductor material 102. Although not required, the stress-inducing semiconductor material 118 could be formed by epitaxially growing an in situ doped material. As used here, "in situ doped" means that a suitable dopant is introduced into a host material as that host material is grown. Epitaxially grown in situ doped material could be utilized here such that the material need not be subjected to subsequent ion implantation for purposes of doping.

The stress-inducing semiconductor material 118 has a different composition than the semiconductor material 102. More specifically, the lattice constant of the stress-inducing semiconductor material 118 is different than the lattice constant of the neighboring semiconductor material 102. The difference in lattice constants contributes to the stress-inducing characteristics of the stress-inducing semiconductor material 118. For an n-type metal-oxide-semiconductor (NMOS) transistor device, the lattice constant of the stress-inducing semiconductor material 118 will be larger than the lattice constant of the semiconductor material 102. Accordingly, the stress-inducing semiconductor material 118 for an NMOS transistor device is a tensile material. In preferred embodiments, the stress-inducing semiconductor material 118 for an NMOS transistor device is silicon germanium. In contrast, for a p-type metal-oxide-semiconductor (PMOS) transistor device, the lattice constant of the stress-inducing semiconductor material 118 will be smaller than the lattice constant of the semiconductor material 102. Accordingly, the stress-inducing semiconductor material 118 for a PMOS transistor device is a compressive material. In preferred embodiments, the stress-inducing semiconductor material 118 for a PMOS transistor device is silicon carbon.

Figure 5:
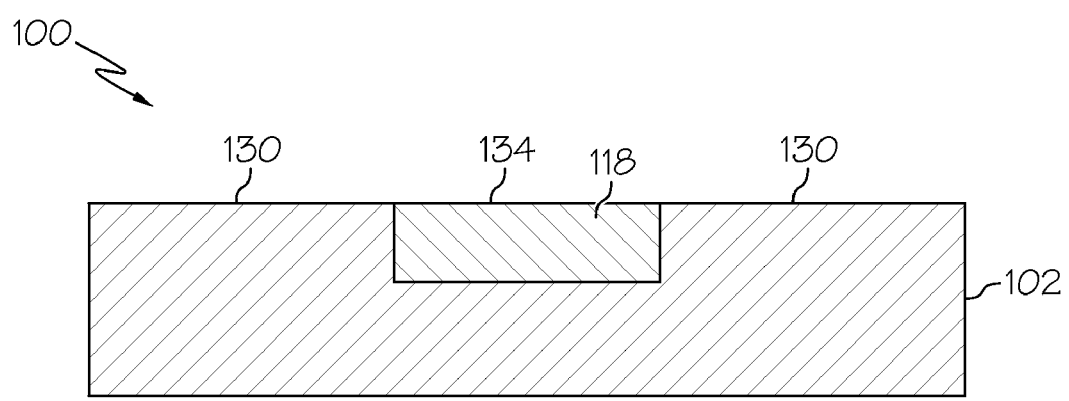

Although other fabrication steps or sub-processes may be performed after the formation of the stress-inducing semiconductor material 118, this example continues by removing the overburden material 126 from the upper surface 120 of the semiconductor material 102 (see FIG. 5). Removal of the overburden material 126 may involve one or more conventional process steps and/or processing tools. For example, chemical mechanical polishing and/or other planarizing techniques can be performed to remove the overburden material 126 and to create a smooth, planar, continuous, and substantially defect-free exposed upper surface of the substrate 100, as depicted in FIG. 5. The intermediate state of the substrate 100 shown in FIG. 5 has an upper surface that corresponds to an exposed portion 130 of the semiconductor material 102 and an exposed portion 134 of the stress-inducing semiconductor material 118. At this intermediate state of the substrate 100, the stress-inducing semiconductor material 118 represents a region of stressed material located in the layer of semiconductor material 102.

Figure 6:
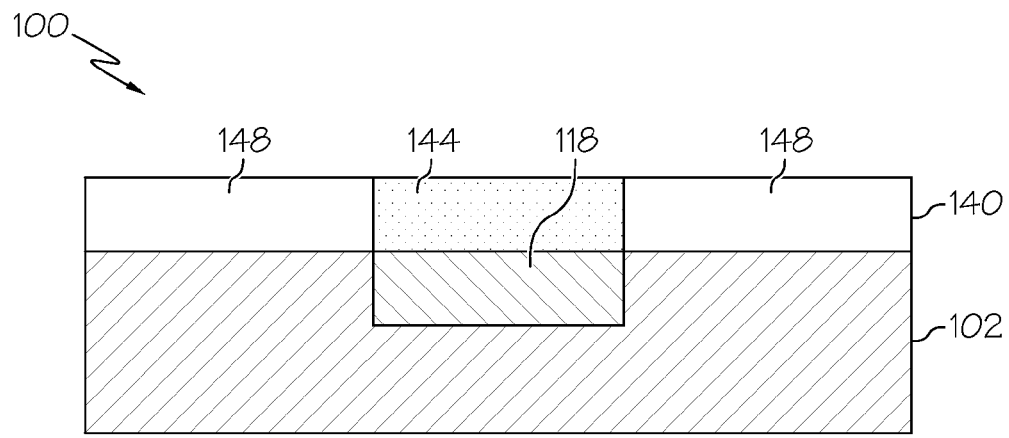

The fabrication process may continue by epitaxially growing a semiconductor material 140 overlying the upper surface of the intermediate-state substrate 100 (see FIG. 6). In this regard, the semiconductor material 140 epitaxially grows from the exposed portion 130 of the semiconductor material 102 and from the exposed portion 134 of the stress-inducing semiconductor material 118. This epitaxial growth process is performed and controlled in a suitable manner to form a stressed zone 144 overlying the stress-inducing semiconductor material 118, and to form nominal zones 148 overlying the layer of semiconductor material 102. Notably, the stressed zone 144 and the nominal zones 148 will have different lattice constants even though their basic material composition is the same (the stressed zone 144 and the nominal zones 148 are formed from the same semiconductor material 140). In particular, the stressed zone 144 will have a lattice constant that is different than the lattice constant of the semiconductor material 102. In certain embodiments, the lattice constant of the stressed zone 144 will also be different than the lattice constant of the stress-inducing semiconductor material 118. For an NMOS transistor, the semiconductor material 102 will have a nominal lattice constant, the stress-inducing semiconductor material 118 will have a lattice constant that is larger than the nominal lattice constant, and the stressed zone 144 will have a lattice constant that is between the nominal lattice constant and the lattice constant of the stress-inducing semiconductor material 118. For a PMOS transistor, the semiconductor material 102 will have a nominal lattice constant, the stress-inducing semiconductor material 118 will have a lattice constant that is smaller than the nominal lattice constant, and the stressed zone 144 will have a lattice constant that is between the nominal lattice constant and the lattice constant of the stress-inducing semiconductor material 118.

For this particular embodiment, the epitaxially grown semiconductor material 140 has the same composition as the layer of semiconductor material 102 (typically, the semiconductor material 140 will be silicon). Consequently, the lattice constant associated with the nominal zones 148 is the same as the lattice constant of the semiconductor material 102. Although not always required, the semiconductor material 140 is preferably formed by epitaxially growing an in situ doped material. The use of in situ doped material is desirable to facilitate efficient and simplified front end processing of semiconductor transistor devices. In this regard, the growth of the semiconductor material 140 can be controlled to provide very good surface quality, to provide the desired doping concentration, to provide the desired doping profile, etc. Although not always required, the semiconductor material 140 will typically be formed as a lightly doped p-type silicon material.

Figure 7:
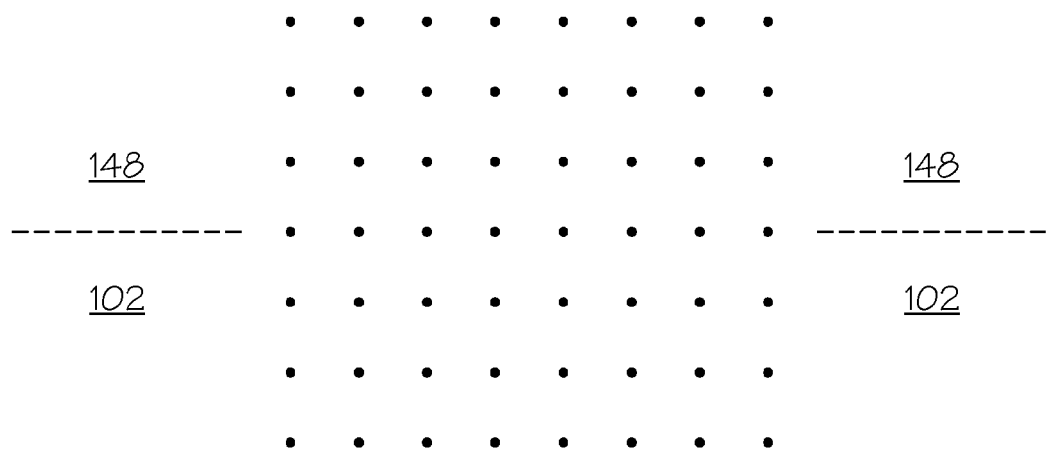
FIG. 7 is a diagram that represents the lattice constant corresponding to two different regions of semiconductor material.

Epitaxial growth of the semiconductor material 140 is an important aspect of this approach. As is well understood by those familiar with semiconductor device fabrication, epitaxial growth is influenced by the crystal lattice structure of the underlying "nucleating" material. Referring to FIG. 5 and FIG. 6, the semiconductor material 102 represents the nucleating material for the nominal zones 148 of the semiconductor material 140. In contrast, the stress-inducing semiconductor material 118 represents the nucleating material for the stressed zone 144 of the semiconductor material 140. Consequently, the nominal zones 148 grown on the semiconductor material 102 retain the lattice constant and the lattice structure of the underlying semiconductor material 102. This relationship is schematically illustrated in FIG. 7, which is a diagram that depicts the lattice constant of the semiconductor material 102 and an overlying nominal zone 148. The dashed line represents the "boundary" between the two semiconductor regions. The spacing of the dots in FIG. 7 is indicative of the lattice constant of the semiconductor material. Notably, the lattice constant is the same for the semiconductor material 102 and the overlying nominal zone 148.

Figure 8:
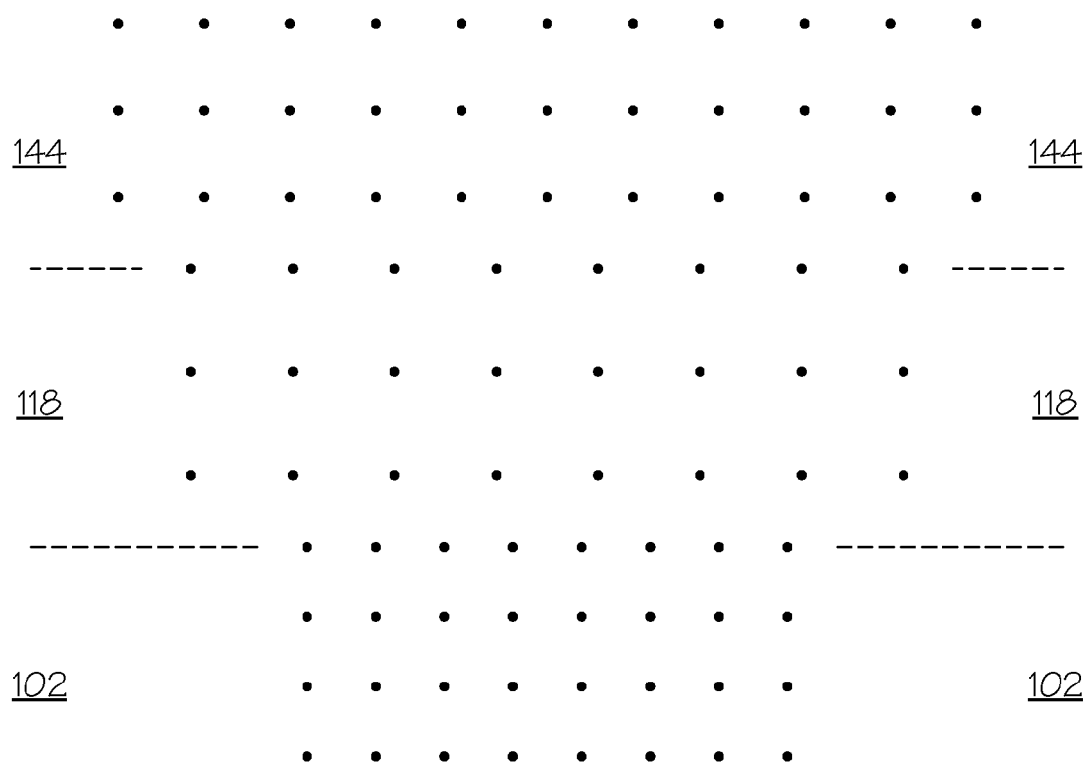
FIG. 8 is a diagram that represents the lattice constants corresponding to three different regions of semiconductor material.

Notably, the stressed zone 144 nucleated from the stress-inducing semiconductor material 118 will exhibit a modified or transitional lattice constant relative to the stress-inducing semiconductor material 118 and relative to the semiconductor material 102. This phenomena is schematically illustrated in FIG. 8, which is a diagram that depicts the lattice constants of the semiconductor material 102, the stress-inducing semiconductor material 118, and the stressed zone 144 (for an NMOS implementation). The dashed lines represent the "boundaries" between the three semiconductor regions. The spacing of the dots in FIG. 8 is indicative of the lattice constants of the respective regions of semiconductor material. In contrast to that shown in FIG. 7, the lattice constant of the stress-inducing semiconductor material 118 is larger than the lattice constant of the underlying semiconductor material 102. Moreover, the lattice constant of the stressed zone 144 is smaller than the lattice constant of the stress-inducing semiconductor material 118. In practice, however, the lattice constant of the stressed zone 144 will not match the lattice constant of the semiconductor material 102 and the nominal zones 148. Accordingly, the stressed zone 144 will exhibit some strain relative to the surrounding nominal zones 148.

Other than the difference in lattice constants, the composition, properties, and characteristics of the layer of epitaxially grown semiconductor material 140 will remain consistent across the nominal zones 148 and the stressed zone 144. More specifically, the doping concentration and profile, the electrical properties, the etching characteristics, the ion implantation characteristics, and the chemical properties will be consistent throughout the layer of semiconductor material 140.

FIG. 6 depicts the semiconductor device substrate 100 in its final form, which is ready for front end processing to create one or more semiconductor transistor devices thereon. This type of substrate 100 could be produced by a fabrication facility or vendor on behalf of a semiconductor device manufacturer. Alternatively, a device manufacturer could have the facilities available to create the substrate 100 and then continue with the front end processing as needed. As mentioned above, fabrication of the substrate 100 will require a priori knowledge of the intended transistor device layout, because the stressed zone 144 formed in the layer of semiconductor material 140 will be used as a channel region of a transistor. Accordingly, the finished substrate 100 might be provided with alignment marks and/or other reference indicators that can be used to align masks (etch masks, ion implantation masks, protective masks, etc.) used during subsequent process steps.

Figure 9:
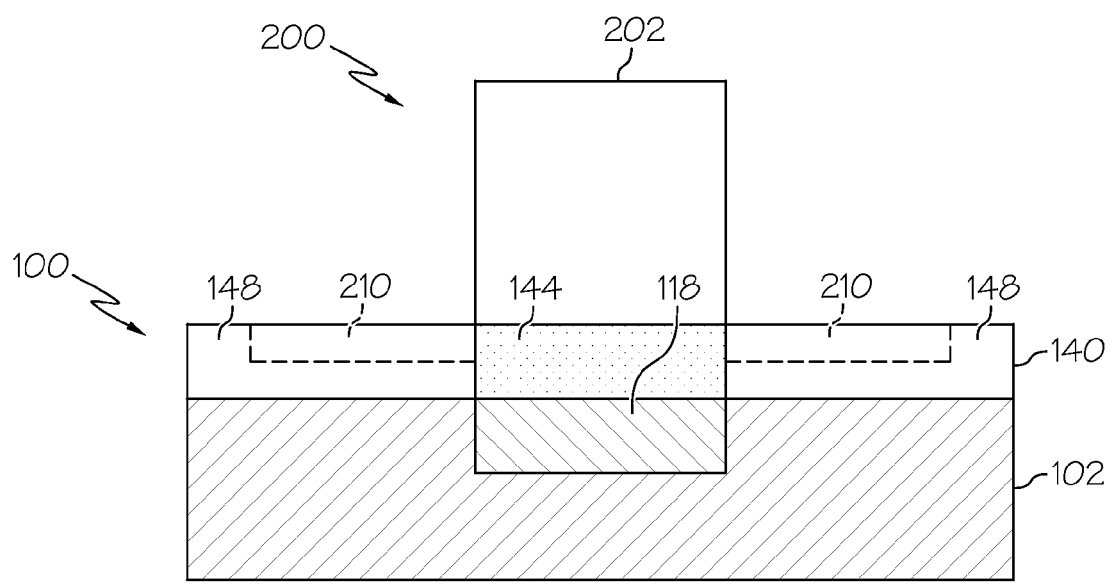
FIG. 9 is a simplified cross-sectional view of a semiconductor transistor device structure formed on a semiconductor device substrate.

FIG. 9 is a simplified cross-sectional view of a semiconductor transistor device structure 200 formed on the semiconductor device substrate 100. The transistor device structure 200 is formed on the semiconductor device substrate 100 using one or more conventional front end process modules. For this example, the transistor device structure 200 includes a gate structure 202 (depicted in a simplified manner) overlying the semiconductor material 140. Notably, the gate structure 202 is laterally aligned with the stressed zone 144 of the epitaxially grown semiconductor material 140. In practice, mask alignment techniques can be implemented during the fabrication of the substrate and the transistor device structure 200 to ensure that the gate structure 202 is properly aligned relative to the stressed zone 144. For example, it may be desirable to align the center of the gate structure 202 with the center of the stressed zone 144. Alternatively (or additionally), it may be desirable to align the sidewalls of the conductive gate electrode or the edges of sidewall spacers relative to the outer edges of the stressed zone 144. Consequently, the stressed zone 144 corresponds to, and serves as, a stressed channel region of the transistor device structure 200. In accordance with well known principles and fabrication techniques, the transistor device structure 200 also includes source and drain regions 210 in the nominal zones 148 of the semiconductor material 140.

Thereafter, any number of known process steps can be performed to complete the fabrication of the semiconductor transistor device structure 200. For the sake of brevity, these process steps and the resulting transistor device are not shown or described here. A MOS transistor device can be manufactured in the manner described here with a "pre-formed" stressed channel region, without having to carry out additional process steps that might normally be associated with conventional processes.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device substrate, the method comprising:
    forming a channel cavity in a layer of first semiconductor material having a first lattice constant;
    filling the channel cavity with a second semiconductor material having a second lattice constant that is different than the first lattice constant;
    obtaining an intermediate-state substrate having an upper surface, the upper surface corresponding to an exposed portion of the first semiconductor material and an exposed portion of the second semiconductor material; and
    epitaxially growing a third semiconductor material on the first semiconductor material and on the second semiconductor material, with the third semiconductor material overlying the upper surface of the intermediate-state substrate, wherein epitaxial growth of the third semiconductor material forms a stressed zone overlying the second semiconductor material, the stressed zone having a third lattice constant that is different than the first lattice constant.

2. The method of claim 1, wherein the third lattice constant is between the first lattice constant and the second lattice constant.

3. The method of claim 1, wherein:
    the first semiconductor material is silicon;
    the second semiconductor material is silicon germanium or silicon carbon; and
    the third semiconductor material is silicon.

4. The method of claim 1, wherein epitaxially growing the third semiconductor material on the first semiconductor material and on the second semiconductor material forms the stressed zone overlying the second semiconductor material and a nominal zone overlying the first semiconductor material, the stressed zone having the third lattice constant and the nominal zone having the first lattice constant.

5. The method of claim 1, wherein filling the channel cavity comprises epitaxially growing the second semiconductor material from a surface of the first semiconductor material that defines a bottom surface of the channel cavity.

6. The method of claim 5, wherein:
epitaxially growing the second semiconductor material results in overburden material grown on an upper surface of the first semiconductor material that flanks the channel cavity; and
obtaining the intermediate-state substrate comprises removing the overburden material from the upper surface of the first semiconductor material.

7. The method of claim 6, wherein removing the overburden material from the upper surface of the first semiconductor material involves chemical mechanical polishing.

8. The method of claim 1, wherein epitaxially growing the third semiconductor material comprises:
epitaxially growing the third semiconductor material from the exposed portion of the first semiconductor material; and
epitaxially growing the third semiconductor material from the exposed portion of the second semiconductor material.

9. The method of claim 1, wherein forming the channel cavity comprises:
creating a patterned mask overlying the layer of first semiconductor material, the patterned mask comprising features corresponding to the channel cavity; and
etching the layer of first semiconductor material, using the patterned mask as an etch mask to define the channel cavity.

10. A semiconductor device substrate comprising:
a layer of first semiconductor material having a first lattice constant;
a region of second semiconductor material located in the layer of first semiconductor material, the second semiconductor material having a second lattice constant that is different than the first lattice constant; and
a layer of epitaxially grown third semiconductor material overlying the layer of first semiconductor material and overlying the region of second semiconductor material, the layer of epitaxially grown third semiconductor material comprising a stressed zone overlying the region of second semiconductor material, the stressed zone having a third lattice constant that is different than the first lattice constant.

11. The semiconductor device substrate of claim 10, wherein the layer of epitaxially grown third semiconductor material comprises a nominal zone overlying the layer of first semiconductor material, the nominal zone having the first lattice constant.

12. The semiconductor device substrate of claim 10, wherein the third lattice constant is different than the second lattice constant.

13. The semiconductor device substrate of claim 10, wherein:
the layer of first semiconductor material comprises silicon;
the region of second semiconductor material comprises silicon germanium; and
the layer of epitaxially grown third semiconductor material comprises silicon.

14. The semiconductor device substrate of claim 10, wherein:
the layer of first semiconductor material comprises silicon;
the region of second semiconductor material comprises silicon carbon; and
the layer of epitaxially grown third semiconductor material comprises silicon.

15. The semiconductor device substrate of claim 10, wherein the region of second semiconductor material comprises an epitaxially grown material that is grown on the first semiconductor material.

16. The semiconductor device substrate of claim 10, wherein the stressed zone of the layer of epitaxially grown third semiconductor material is grown on the second semiconductor material.

17. A method of fabricating a semiconductor device structure, the method comprising:
fabricating a semiconductor device substrate comprising a layer of first semiconductor material, a region of second semiconductor material located in the layer of first semiconductor material, a stressed zone of epitaxially grown third semiconductor material overlying the region of second semiconductor material, and nominal zones of the epitaxially grown third semiconductor material overlying the first semiconductor material; and
forming a semiconductor transistor device structure on the semiconductor device substrate, the semiconductor transistor device structure comprising a gate structure aligned with the stressed zone of epitaxially grown third semiconductor material, such that the stressed zone of epitaxially grown third semiconductor material corresponds to a stressed channel region of the semiconductor transistor device structure.

18. The method of claim 17, wherein:
the semiconductor transistor device structure is an n-type metal-oxide-semiconductor (NMOS) transistor device structure;
the first semiconductor material is silicon having a first lattice constant;
the second semiconductor material is silicon germanium having a second lattice constant that is larger than the first lattice constant; and
the stressed zone is formed from epitaxially grown silicon having a third lattice constant that is larger than the first lattice constant.

19. The method of claim 17, wherein forming the semiconductor transistor device structure comprises forming source and drain regions in the nominal zones of the epitaxially grown third semiconductor material.

20. The method of claim 17, wherein fabricating the semiconductor device substrate comprises:
forming a channel cavity in the layer of first semiconductor material;
epitaxially growing the second semiconductor material from the first semiconductor material to fill the channel cavity;
obtaining an intermediate-state substrate having an upper surface, the upper surface corresponding to an exposed portion of the first semiconductor material and an exposed portion of the second semiconductor material; and
epitaxially growing the third semiconductor material from the exposed portion of the first semiconductor material to obtain the nominal zones of the epitaxially grown third semiconductor material, and from the exposed portion of the second semiconductor material to obtain the stressed zone of epitaxially grown third semiconductor material.

* * * * *